(12) United States Patent
Minato et al.

(10) Patent No.: US 8,329,563 B2
(45) Date of Patent: Dec. 11, 2012

(54) SEMICONDUCTOR DEVICE INCLUDING A GETTERING LAYER AND MANUFACTURING METHOD THEREFOR

(75) Inventors: Tadaharu Minato, Tokyo (JP); Hidekazu Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 773 days.

(21) Appl. No.: 12/159,787

(22) PCT Filed: Feb. 24, 2006

(86) PCT No.: PCT/JP2006/303469
§ 371 (c)(1),
(2), (4) Date: Jul. 1, 2008

(87) PCT Pub. No.: WO2007/096996
PCT Pub. Date: Aug. 30, 2007

(65) Prior Publication Data
US 2009/0267191 A1  Oct. 29, 2009

(51) Int. Cl.
*H01L 21/322* (2006.01)
(52) U.S. Cl. .......... 438/471; 438/58; 438/143; 438/310; 438/402; 438/473; 438/474; 438/475; 438/476; 257/913; 257/E21.318; 257/E21.321
(58) Field of Classification Search .......... 438/58, 438/143, 310, 402, 471, 473, 474, 475, 476, 438/FOR. 144; 257/913, E21.318, E21.321
See application file for complete search history.

(56) References Cited

U.S. PATENT DOCUMENTS

| 5,194,395 A | * | 3/1993 | Wada | 438/143 |
| 5,223,734 A | * | 6/1993 | Lowrey et al. | 257/401 |
| 2006/0006488 A1 | * | 1/2006 | Kanbe | 257/443 |

FOREIGN PATENT DOCUMENTS

| EP | 0 373 723 A1 | 6/1990 |
| JP | 52-044163 | 4/1977 |
| JP | 53 130979 | 11/1978 |
| JP | 54-014665 | 2/1979 |
| JP | 59 54230 | 3/1984 |
| JP | 60 89932 | 5/1985 |
| JP | 62-072132 | 4/1987 |

(Continued)

OTHER PUBLICATIONS

E. Herr, et al., "Improving the Gate Oxide Integrity of Very High Voltage MCT and IGBT Devices by External Gettering of Metal Impurities", Proceedings of the 6th International Symposium on Power Semiconductor Devices and ICS, XP002523031, May 31-Jun. 2, 1994, pp. 213-218.

(Continued)

*Primary Examiner* — Matthew E Warren
*Assistant Examiner* — David Chen
(74) *Attorney, Agent, or Firm* — Oblon, Spivak, McClelland, Maier & Neustadt, L.L.P.

(57) ABSTRACT

A device and a device manufacturing process. First, a gettering layer is formed on the bottom surface of a silicon substrate. Gates having a MOS structure are then formed on the principal surface of the silicon substrate, and the gettering layer is removed. According to this manufacturing method, the formation of the gates having a MOS structure is performed such that the gettering layer getters dissolved oxygen present in the silicon substrate. This reduces the concentration of dissolved oxygen in the silicon substrate, resulting in improved device characteristics.

4 Claims, 8 Drawing Sheets

FOREIGN PATENT DOCUMENTS

| | | |
|---|---|---|
| JP | 62 221122 | 9/1987 |
| JP | 63 108729 | 5/1988 |
| JP | 64 12537 | 1/1989 |
| JP | 3 173131 | 7/1991 |
| JP | 4 218921 | 8/1992 |
| JP | 5 136153 | 6/1993 |
| JP | 5 206146 | 8/1993 |
| JP | 7 38102 | 2/1995 |
| JP | 8 97164 | 4/1996 |
| JP | 9 260392 | 10/1997 |
| JP | 11-168210 | 6/1999 |
| JP | 2002-507058 | 3/2002 |
| JP | 2004 87665 | 3/2004 |
| JP | 2005 145744 | 6/2005 |

OTHER PUBLICATIONS

G. A. Rozgonyi, et al., "Elimination of Oxidation-Induced Stacking Faults by Preoxidation Gettering of Silicon Wafers. I. Phosphorus Diffusion-Induced Misfit Dislocations", Journal of the Electrochemical Society, vol. 122, No. 12, XP002523317, Dec. 1975, pp. 1725-1729.

Japanese Office Action for Japanese Application Serial No. 2008-501549, dated Jun. 28, 2012, and English translation of relevant portions.

Japanese Office Action mailed on Dec. 13, 2011 for Application No. JP 2008-501549 (with English translation).

* cited by examiner

SEMICONDUCTOR DEVICE INCLUDING A GETTERING LAYER AND MANUFACTURING METHOD THEREFOR

TECHNICAL FIELD

The present invention relates to a semiconductor device and a manufacturing method therefor, and more particularly to a semiconductor device and a manufacturing method therefor employing a high resistivity silicon substrate, which is a power semiconductor device material.

BACKGROUND ART

The MCZ (magnetic field applied Czochralski) method and the FZ (floating zone) method have been widely used to produce silicon wafers. These silicon wafers are used to manufacture various semiconductor devices.

When such a silicon wafer is produced and used to manufacture a semiconductor device, the wafer is subjected to an oxidation diffusion process at an elevated temperature, which causes oxygen to enter into and remain in the wafer as dissolved oxygen.

When the silicon substrate (or wafer) is heat treated at a low temperature during the semiconductor device manufacturing process, the dissolved oxygen forms thermal donors, thereby changing the resistivity of the silicon substrate. Therefore, it is desirable to reduce the amount of oxygen dissolved into the silicon substrate as much as possible during the wafer production process and the semiconductor device manufacturing process (see, e.g., Patent Document 1 below).
Patent Document 1: JP-A-2005-145744

DISCLOSURE OF THE INVENTION

Problems to be Solved by the Invention

Reducing the oxygen concentration of a silicon wafer as it is being produced requires an increase in the complexity and cost of the production process. A solution to this problem is a method of manufacturing a device structure on a silicon wafer in such a way that the device characteristics are good and exhibit little variation even if the wafer has a relatively high concentration of dissolved oxygen when produced (i.e., before the device manufacturing process).

The present invention has been devised to solve the above problems. It is, therefore, an object of the present invention to manufacture a device on a silicon wafer in such a way that the device characteristics are good and exhibit little variation even if the wafer has a relatively high concentration of dissolved oxygen before the device manufacturing process.

Means for Solving the Problems

A semiconductor device of the present invention comprises: a silicon substrate having a first surface and a second surface and formed by a floating zone method or a magnetic field applied Czochralski method; a first conductive region provided in said first surface; and a trace-bearing portion provided in said second surface and including a trace of removal of at least a portion of a gettering layer for gettering dissolved oxygen or residual metal in said silicon substrate.

A method for manufacturing a semiconductor device of the present invention, comprises the steps of: forming a gettering layer on a second surface of a silicon substrate formed by a floating zone method or a magnetic field applied Czochralski method, wherein said silicon substrate further has a first surface, and wherein said gettering layer serves to getter dissolved oxygen or residual metal in said silicon substrate; heat treating said silicon substrate; removing at least a portion of said gettering layer.

Effect of the Invention

Thus, the present invention allows a device to be manufactured on a silicon wafer in such a way that the device characteristics are good and exhibit little variation even if the wafer has a relatively high concentration of dissolved oxygen.

DESCRIPTION OF REFERENCE NUMERALS 1 silicon substrate
3a gettering layer
5 gate
6 metal wiring
8 n-type buffer layer
9 p-type collector layer
10 heavy metal
11 dissolved oxygen
12 wafer
14 anode electrode
15 cathode electrode
16 n-type impurity layer

BEST MODES FOR CARRYING OUT THE INVENTION

Preferred embodiments of the present invention will now be described with reference to the accompanying drawings. It should be noted that in the figures, like numerals are used to denote like or corresponding components to simplify the description and avoid undue repetition.

First Embodiment

There will now be described, with reference to FIG. 1, a semiconductor device and a manufacturing method therefor according to a first embodiment of the present invention. This semiconductor device is manufactured from a silicon substrate (or silicon wafer) produced by the floating zone (FZ) method or the magnetic field applied Czochralski (MCZ) method.

The silicon substrate has a first surface (or first principal surface) and a second surface (or second principal surface), and a device such as a transistor is formed on the first principal surface side of the substrate by a device manufacturing process. This silicon substrate is doped with an n-type impurity and contains a predetermined concentration of dissolved oxygen.

Figure 1:
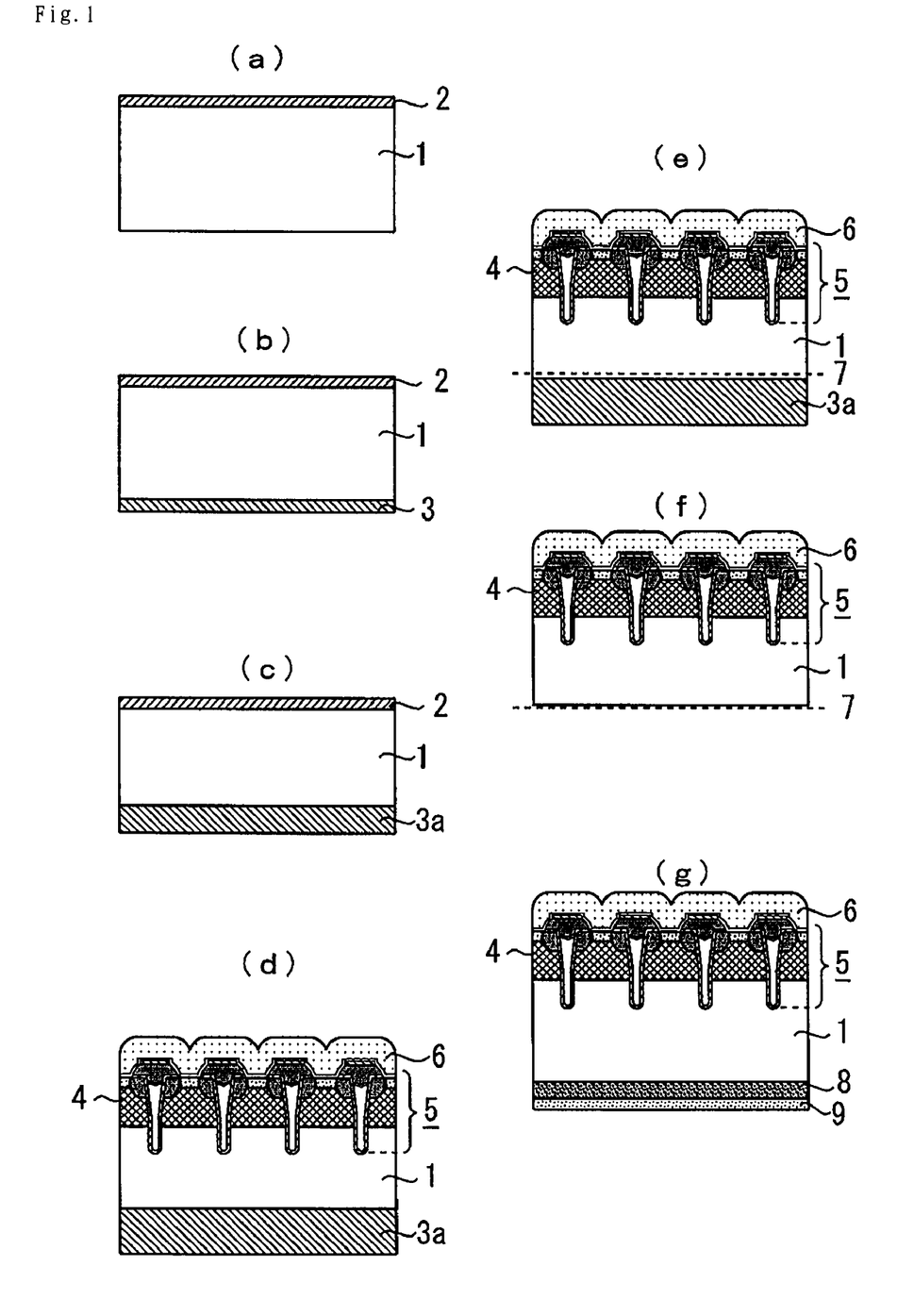
FIG. 1 Figure shows a manufacturing method for a semiconductor device according to a first embodiment.

First, a silicon oxide film 2 is formed on the first principal surface of the silicon substrate 1, as shown in FIG. 1(a). Next, phosphorus is diffused into the second principal surface of the silicon substrate 1 to form a high concentration impurity layer 3, as shown in FIG. 1(b). This impurity layer is then heat treated to form a gettering layer 3a over the second principal surface of the silicon substrate 1, as shown in FIG. 1(c). The gettering layer 3a can getter dissolved oxygen or residual metal in the silicon substrate 1, as described later.

One method of diffusing phosphorus as described above is to use phosphine ($PH_3$) as a source gas. Another method is to use vapor of liquid phosphorus oxychloride ($POCl_3$). Still another method is to place the silicon substrate 1 and solid boron phosphide (BP) in a diffusion furnace.

It should be noted that the impurity layer 3 may be formed by phosphorus ion implantation. The formation of the impurity layer 3 by phosphorus diffusion or phosphorus ion implantation allows the gettering layer 3a to have the desired concentration profile.

The gettering layer containing phosphorus as an impurity will now be described. When a silicon substrate containing phosphorus is oxidized, regions of the substrate containing a high phosphorus concentration are oxidized at a higher rate than those containing no phosphorus. If the phosphorus-containing regions have a phosphorus concentration of $1\times10^{18}$ atoms/$cm^2$ or more, they will undergo enhanced oxidation, that is, their oxidation rate will be 3 to 5 times higher than those of the other regions, although this may vary depending on the oxidation conditions. Further, the oxidation rate of these phosphorus-containing regions may be one or more orders of magnitude higher than those of the other regions if they contain a phosphorus concentration of $1\times10^{19}$ atoms/$cm^2$ or more.

When such enhanced oxidation occurs, most of the oxygen supply for oxidizing the silicon substrate is externally delivered. However, some of the dissolved oxygen in the silicon substrate is also consumed at that time. That is, if enhanced oxidation occurs in the silicon substrate after the gettering layer 3a is formed therein, the gettering layer 3a getters dissolved oxygen in the substrate.

A silicon oxide film includes approximately $5\times10^{22}$ atoms per cubic centimeter (atoms/$cm^3$). These atoms include approximately $1.5\times10^{22}$ oxygen atoms. Therefore, the formation of a silicon oxide film having a thickness of 1 μm (or $1\times10^{-4}$ cm) consumes an amount of oxygen equivalent to a dose amount of approximately $1.5\times10^{18}$ atoms/$cm^2$ (i.e., $1.5\times10^{22}$ atoms/$cm^3 \times 1\times10^{-4}$ cm=$1.5\times10^{18}$ atoms/$cm^2$).

In the above enhanced oxidation, if 1 to 10% of the oxygen used to oxidize the silicon substrate comes from the dissolved oxygen in the substrate, the amount of dissolved oxygen consumed is equivalent to a dose amount of $1.5\times10^{16}$ to $1.5\times10^{17}$ atoms/$cm^2$. If the silicon substrate has a thickness of 100 μm (or $1\times10^{-2}$ cm), the gettering layer getters $1.5\times10^{18}$ to $1.5\times10^{19}$ dissolved oxygen atoms per cubic centimeter volume of the substrate (atoms/$cm^3$), (i.e., $1.5\times10^{16}$ to $1.5\times10^{17}$ atoms/$cm^2$/$1\times10^{-2}$ cm=$1.5\times10^{18}$ to $1.5\times10^{19}$ atoms/$cm^3$).

Although the gettering layer 3a has been described as containing phosphorus as an impurity, it is to be understood that other n-type impurities such as arsenic or antimony may be substituted therefor, or p-type impurities such as silicon, aluminum, or gallium may be substituted. Further, the gettering layer 3a may contain as an impurity a Group IV element such as boron, germanium, or carbon, or a neutral element such as argon or helium.

Therefore, one of the above impurities may be diffused in the silicon substrate 1 to form the gettering layer. Alternatively, the silicon substrate 1 may be ion-implanted with such an impurity and then heat treated to form the gettering layer.

Next, a p-type diffusion layer 4 (or first conductive region) is formed on the first principal surface of the silicon substrate 1, as shown in FIG. 1(d). This is accomplished by a thermal diffusion process. At that time, if enhanced oxidation occurs in the silicon substrate 1, the gettering layer 3a getters dissolved oxygen in the substrate, thereby reducing the concentration of dissolved oxygen in the silicon substrate 1.

Thus, the gettering layer 3a is formed on the second principal surface of the silicon substrate 1, and then the substrate is heat treated to getter dissolved oxygen therein. As a result, the gettering layer 3a getters dissolved oxygen contained in the silicon substrate 1, resulting in a reduction in the concentration of dissolved oxygen of the substrate 1. Further, not only can the gettering layer 3a getter dissolved oxygen in the silicon substrate 1, but also it can getter residual metal in the substrate 1.

Next, a trench gate structure, e.g., including gates 5 (or first electrodes) of insulated gate bipolar transistors (hereinafter referred to as "IGBTs") is formed in the first principal surface of the silicon substrate 1, as shown in FIG. 1(d). Metal wiring 6 of Al, etc. is then formed over the first principal surface of the silicon substrate 1. It should be noted that heavy metals such as Fe may undesirably diffuse in the silicon substrate 1 during the wafer production process at the wafer manufacturer's site or during the device manufacturing process. This may occur accidentally or due to the fact that materials used to form the wafer or devices are of low purity. Such metals nucleate crystal defects in the silicon substrate 1 or create carrier trap states in the semiconductor bandgap, thereby degrading the device characteristics.

As described above, the gettering layer 3a contains phosphorus, which has the property of causing metal to agglomerate by diffusion transport in a solid. Therefore, the gettering layer 3a can getter heavy metals such as Fe present in the silicon substrate 1 even when they are distributed throughout the substrate. This prevents a reduction in the lifetime of the current carriers (holes and electrons) in the silicon substrate 1, as well as reducing the leakage current flowing when a voltage is applied to the device.

Next, referring to FIG. 1(e), the second principal surface of the silicon substrate 1 is mechanically ground to remove the portion of the substrate 1 below the broken line 7. This results in the removal of the entire gettering layer 3a, producing the structure shown in FIG. 1(f). It should be noted that the gettering layer 3a may be removed by a chemical process such as dry or wet etching. The removal of the gettering layer 3a leaves a trace-bearing portion (not shown) bearing traces of the removal on the second principal surface side of the silicon substrate 1.

The removal of the gettering layer 3a allows reduction of the concentrations of heavy metals and dissolved oxygen in the silicon substrate 1, thereby limiting the increase in the junction leakage current due to the presence of the heavy metals in the silicon substrate 1. Further, it is also possible to limit the variation in the resistivity of the silicon substrate 1 due to the dissolved oxygen.

Next, as shown in FIG. 1(g), an n-type buffer layer 8 containing an n-type impurity is formed over the second principal surface of the silicon substrate 1, thereby covering the trace-bearing portion bearing traces of the removal of the gettering layer 3a. For example, the n-type buffer layer 8 is formed by means of phosphorus ion implantation and heat treatment. A p-type collector layer 9 (or second conductive region) containing a p-type impurity is then formed to cover the n-type buffer layer 8. For example, the p-type collector layer 9 is formed by means of boron ion implantation and heat treatment.

Thus, according to the present embodiment, first the gettering layer 3a is formed on the silicon substrate 1, which is then heat treated to cause the gettering layer 3a to getter dissolved oxygen and residual metals in the substrate 1. Next, the metal wiring (aluminum wiring) 6 is formed, and the gettering layer 3a is removed. Then the second conductive region (or p-type collector layer 9) is formed.

That is, according to the present embodiment, the step of forming the metal wiring 6 on the first principal surface of the semiconductor substrate 1 is performed after the step of heat treating the silicon substrate 1 and before the step of removing the gettering layer 3a. Further, the second conductive region is formed in the second principal surface side of the silicon substrate 1 after the step of removing the gettering layer 3a. Specifically, the second conductive region forming step first forms an impurity layer on the second principal surface side of the silicon substrate 1 by ion implantation, etc., and then heat treats the substrate at a temperature (300 to 450° C.) lower than the melting point of the metal wiring (or aluminum wiring) 6 to activate the impurity layer.

Thus, the manufacturing method described above allows the manufacture of a semiconductor device including: a silicon substrate 1 having a first surface (or first principal surface) and a second surface (or second principal surface) and formed by the FZ or MCZ method; a first conductive region (or p-type diffusion layer 4) provided in the first principal surface; and a trace-bearing portion provided in the second principal surface and including a trace of removal of at least a portion of a gettering layer for gettering dissolved oxygen or residual metal in the silicon substrate 1.

The semiconductor device is further configured such that a second conductive region (or p-type collector layer 9) is provided in the second principal surface so as to cover the trace-bearing portion. That is, the structure shown in FIG. 1(g) is a vertical device structure made up of the first conductive region (or p-type diffusion layer 4), the silicon substrate 1, and the second conductive region (or p-type collector layer 9).

The trace-bearing portion has a shorter carrier lifetime than the other portions of the silicon substrate 1. More specifically, the trace-bearing portion has a shorter carrier lifetime than the other portions of the substrate 1 by a factor of 10 or more. This trace-bearing portion can be used as a control layer for locally controlling the carrier lifetime of the silicon substrate 1.

Figure 2:
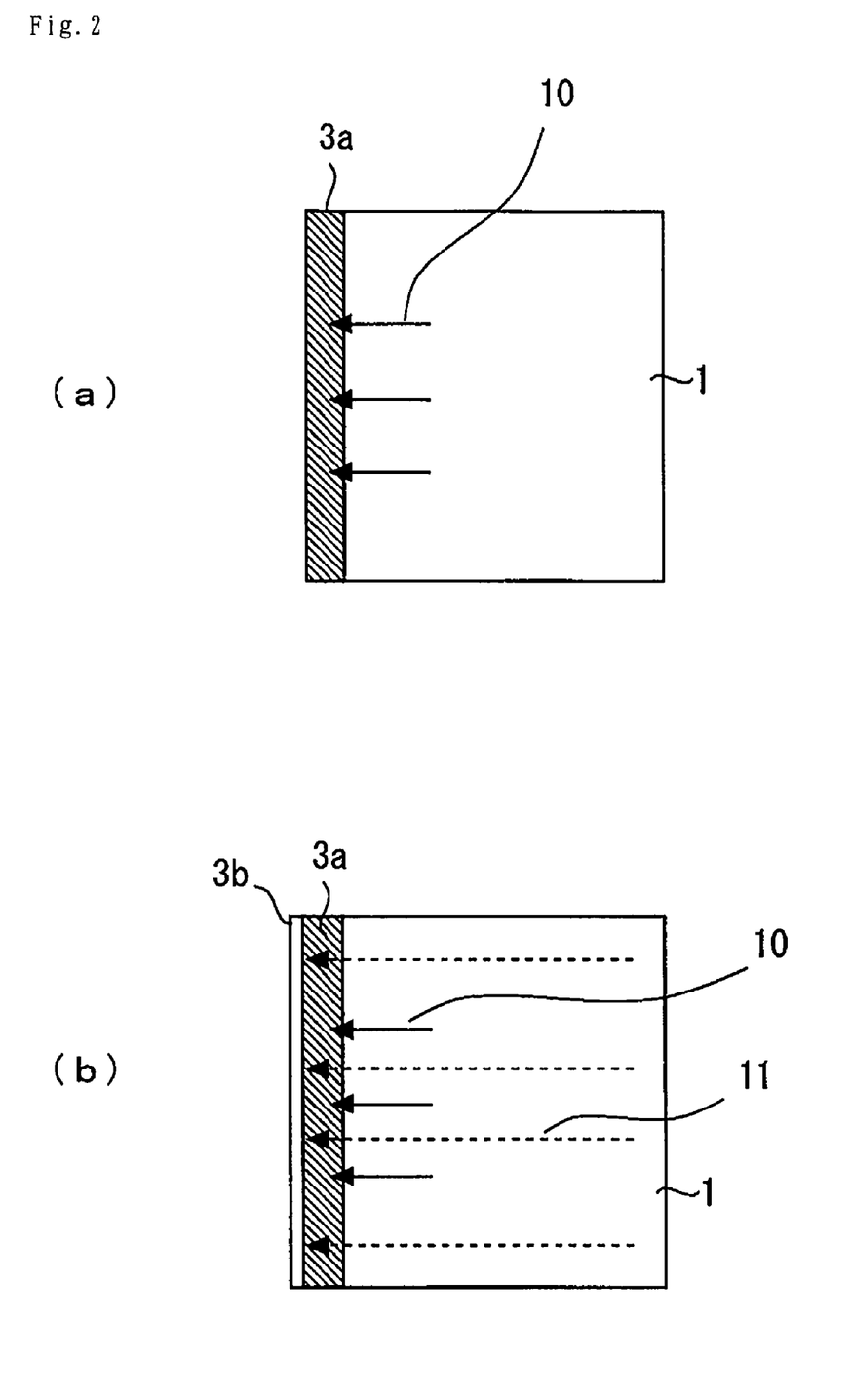
FIG. 2 Figure shows the gettering of heavy metals and dissolved oxygen.

The gettering of heavy metals and dissolved oxygen by the gettering layer 3a will now be described with reference to FIG. 2. As shown in FIGS. 2(a) and 2(b), the gettering layer 3a is formed on the second principal surface of the silicon substrate 1 (the left surface in FIG. 2(a)). When the silicon substrate 1 contains heavy metal 10, the gettering layer 3a getters the metal by causing it to agglomerate by diffusion transport, as shown in FIG. 2(a). Further, when enhanced oxidation occurs in the silicon substrate 1 due to the application of a high temperature diffusion process, etc., not only does the gettering layer 3a getter the heavy metal 10, but also dissolved oxygen in the silicon substrate 1 segregates on the surface of the gettering layer 3a, as shown in FIG. 2(b). This results in the formation of a silicon oxide film 3b over the surface of the gettering layer 3a. Thus, the gettering layer 3a getters heavy metals and dissolved oxygen present in the silicon substrate.

As described above, the present embodiment eliminates the need to greatly reduce the concentration of dissolved oxygen in a wafer before forming a device on the wafer, resulting in reduced manufacturing cost. Further, the present embodiment allows the concentration of dissolved oxygen in a silicon substrate to be adjusted in the device manufacturing process, thereby increasing the flexibility of the application of the silicon substrate. That is, the present embodiment allows a device to be manufactured on a silicon wafer in such a way that the device characteristics are good and meet the requirements of the application and exhibit little variation even if the wafer has a relatively high concentration of dissolved oxygen before the device manufacturing process.

In the present embodiment, the gettering layer 3a is formed in the silicon substrate at the beginning of the device manufacturing process. In other embodiments, however, the gettering layer 3a may be formed before the device manufacturing process and may be removed after it getters dissolved oxygen in the silicon substrate. This allows the concentration of dissolved oxygen in the substrate to be reduced before the device manufacturing process.

Further, in the present embodiment, the gates 5 having a trench gate structure are formed on the first principal surface side of the silicon substrate 1, and the LPT (light punch through) structure including the n-type buffer layer 8 and the p-type collector layer 9 is formed on the second principal surface side of the silicon substrate 1. It is to be understood, however, that in other embodiments the LPT structure may be replaced by an FS (field stop) structure or an SPT (soft punch through) structure, which are similar to the LPT structure. Further, although in the present embodiment the trench gate structure shown in FIG. 1 is formed on the first principal surface side of the silicon substrate 1, it is to be understood that the trench gate structure may be replaced by one of the following structures: an IEGT (injection enhanced gate transistor), a planar gate structure, a MOS gate structure, a "junction type" thyristor, a GTO (gate turn-off) thyristor, a GCT (gate commutated turn-off), an SITh (static induction thyristor), and a simple diode structure with no control electrode.

Further, although in the present embodiment phosphorus is used to form the gettering layer 3a, it is to be understood that in other embodiments any other element may be substituted therefor which has the effect of gettering heavy metal or dissolved oxygen, as described above. Further, although in the present embodiment the silicon substrate 1 is an n-type silicon substrate, it is to be understood that in other embodiments the substrate may be a p-type silicon substrate and the conductivity types of the other layers or regions in this semiconductor device may be reversed. Still further, the silicon substrate 1 may be a substrate made of an intrinsic semiconductor (containing no n-type and p-type impurities).

Second Embodiment

There will now be described, with reference to FIG. 3, a method for manufacturing a semiconductor device according to a second embodiment of the present invention. The following description will be primarily directed to the differences from the first embodiment. This method begins by performing the four steps shown in FIGS. 3(a) to 3(d) from the step of forming a silicon oxide film on a first principal surface of a silicon substrate 1 to the step of forming metal wiring 6, as in the first embodiment.

Next, referring to FIG. 3(e), the second principal surface of the silicon substrate 1 is mechanically ground to remove the portion of the substrate 1 below the broken line 7. That is, a portion of the gettering layer 3a is removed such that the remaining portion of the gettering layer 3a has a predetermined thickness, producing the structure shown in FIG. 3(f). This allows limiting the increase in the junction leakage current due to the presence of heavy metals in the silicon substrate, as in the first embodiment. Further, it is also possible to limit the variation in the resistivity of the silicon substrate 1 due to dissolved oxygen in the substrate.

Figure 3:
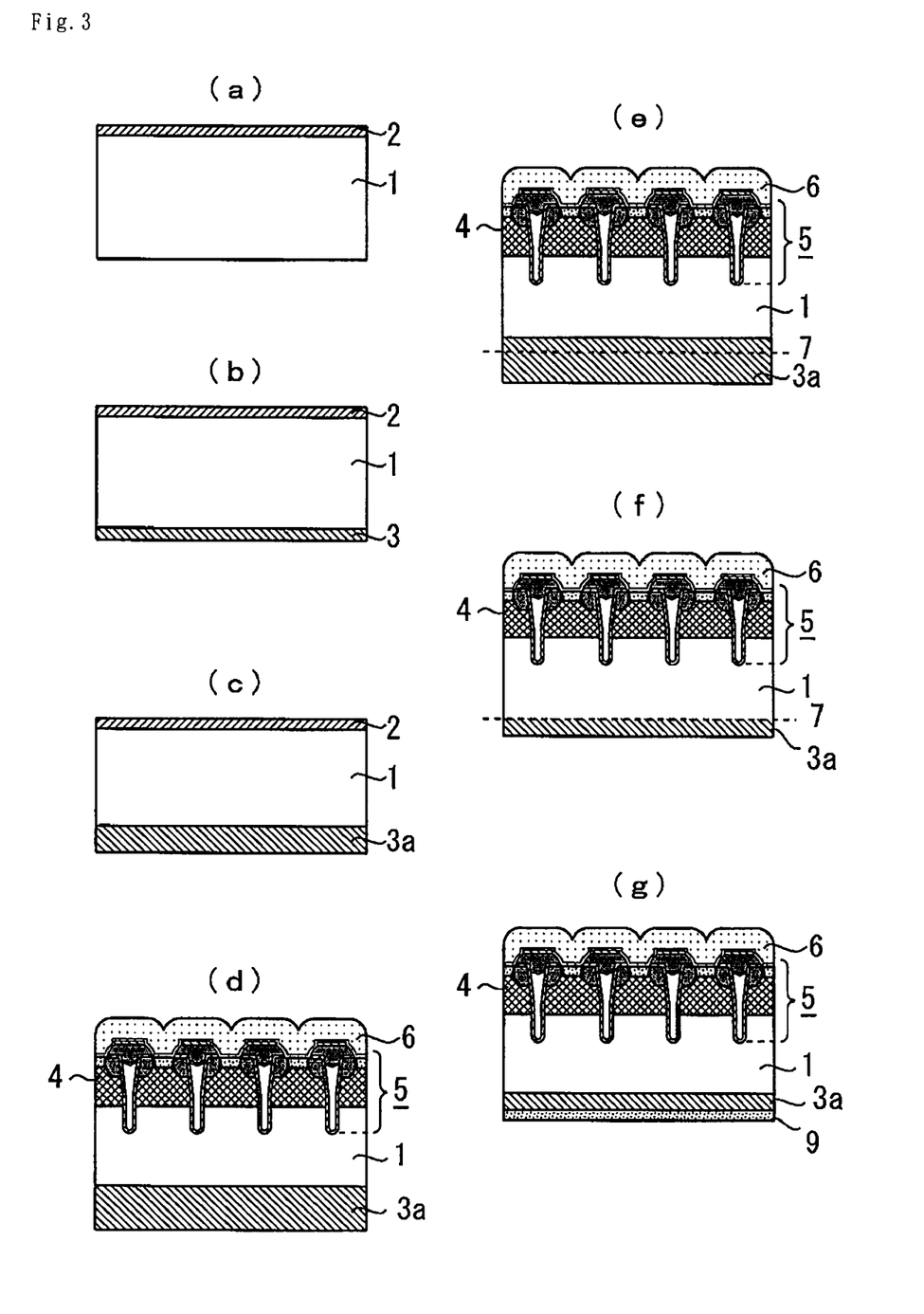
FIG. 3 Figure shows a manufacturing method for a semiconductor device according to a second embodiment.

Next, as shown in FIG. 3(g), a p-type collector layer 9 containing a p-type impurity is formed over the second principal surface of the silicon substrate 1, thereby covering the remaining portion of the gettering layer 3a. For example, the p-type collector layer 9 is formed by first ion-implanting the second principal surface of the silicon substrate 1 with boron and then heat treating the substrate.

According to the present embodiment, a portion of the gettering layer 3a is removed such that the remaining portion of the gettering layer 3a has a predetermined thickness, as described above. On the other hand, according to the method of the first embodiment, the entire gettering layer 3a is removed. Thus, the second embodiment eliminates the step of forming the n-type buffer layer 8 described in connection with the first embodiment, since, according to the method of the second embodiment, only a portion of the gettering layer 3a is removed. That is, the second embodiment can reduce the total number of process steps as compared to the first embodiment while retaining the advantages of the first embodiment.

Thus, the second embodiment can reduce the total number of process steps as compared to the first embodiment while retaining the advantages of the first embodiment.

Third Embodiment

Figure 4:
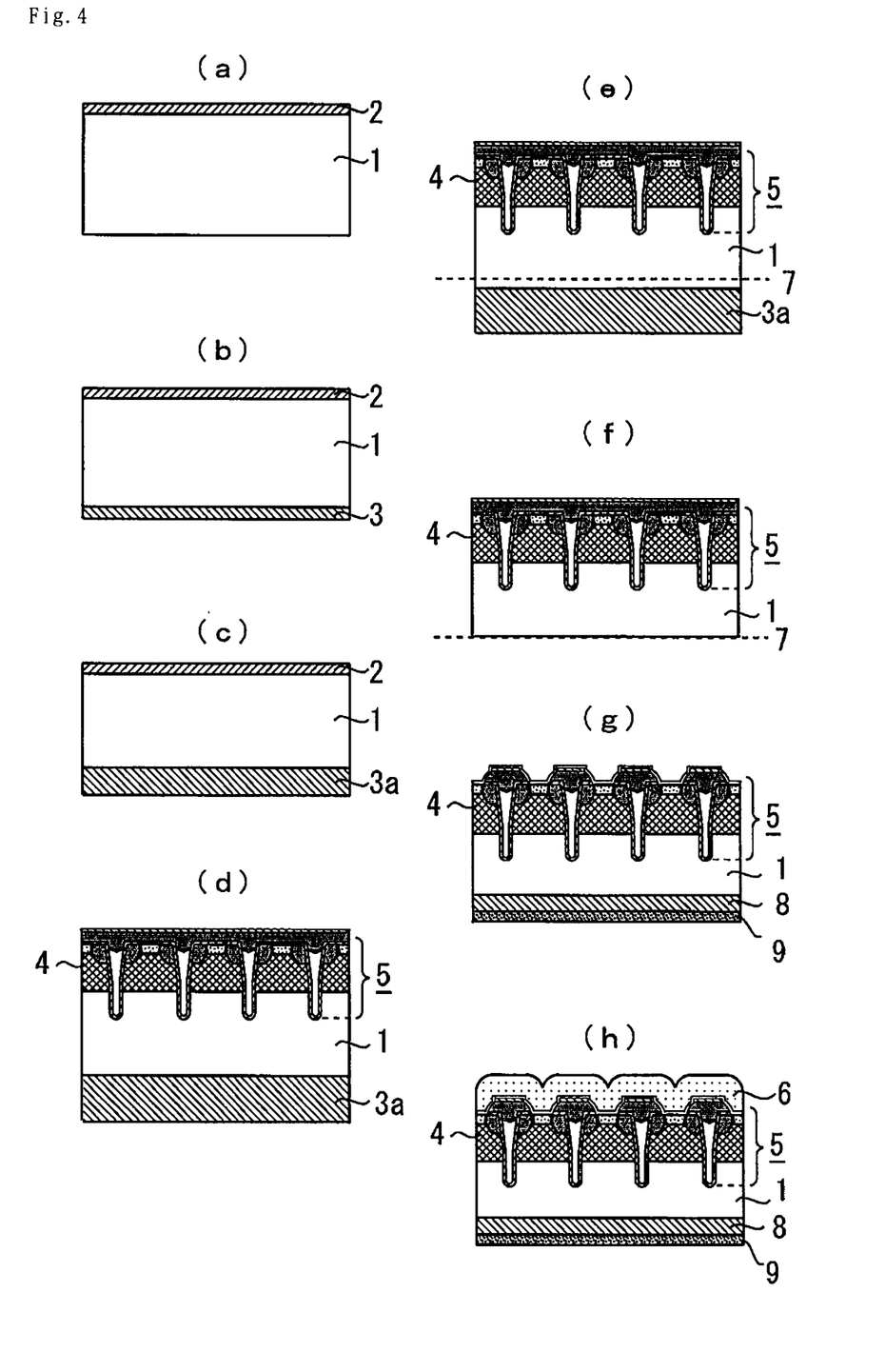
FIG. 4 Figure shows a manufacturing method for a semiconductor device according to a third embodiment.

There will now be described, with reference to FIG. 4, a method for manufacturing a semiconductor device according to a third embodiment of the present invention. The following description will be primarily directed to the differences from the first embodiment. It should be noted that, according to the method of the first embodiment, the gettering layer 3a is removed after the metal wiring 6 is formed. On the other hand, according to the method of the present embodiment, the metal wiring 6 is formed after the gettering layer 3a is removed and after the n-type buffer layer 8 and the p-type collector layer 9 are formed.

For example, this method begins by performing the four steps shown in FIGS. 4(a) to 4(d) from the step of forming a silicon oxide film 2 on a first principal surface of a silicon substrate 1 to the step of forming gates 5, as in the first embodiment. Then, referring to FIG. 4(e), the second principal surface of the silicon substrate 1 is mechanically ground to remove the entire gettering layer 3a, producing the structure shown in FIG. 4(f). An n-type buffer layer 8 and a p-type collector layer 9 are then sequentially formed on the second principal surface of the silicon substrate 1 by means of ion implantation and heat treatment. Further, metal wiring 6 of Al, etc. is formed over the gates 5.

In the above example, the entire gettering layer 3a is removed before the n-type buffer layer 8 and the p-type collector layer 9 are formed. However, as in the second embodiment, only a portion of the gettering layer 3a may be removed, and the p-type collector layer 9 may be formed to cover the remaining portion of the gettering layer 3a. Then the metal wiring 6 may be formed.

That is, according to the present embodiment, the metal wiring 6 is formed on the first principal surface of the silicon substrate 1 after the gettering layer 3a is removed and after the n-type buffer layer 8 and the p-type collector layer 9 are formed on the second principal surface of the silicon substrate 1. Alternatively, the metal wiring 6 is formed on the first principal surface of the silicon substrate 1 after a portion of the gettering layer 3a is removed and after the p-type collector layer 9 is formed on the second principal surface of the silicon substrate 1. Thus, in both cases, the metal wiring 6 is formed after the p-type collector layer 9 is formed, thereby avoiding a situation where the high temperature heat treatment used to form the p-type collector layer 9 affects the metal wiring 6. Therefore, the present embodiment allows the semiconductor device to have good characteristics while retaining the advantages of the first and the second embodiments.

This manufacturing method can be used to form a high voltage IGBT (2500 V or higher), etc. if a heat treatment can be applied to the silicon substrate before or after the formation of the contact holes, that is, if the silicon substrate has a sufficient thickness after the IGBT structure is formed and after the second principal surface of the silicon substrate is ground.

Thus, the present embodiment allows the semiconductor device to have good characteristics while retaining the advantages of the first and second embodiments.

Fourth Embodiment

There will now be described, with reference to FIG. 5, a method for manufacturing a semiconductor device according to a fourth embodiment of the present invention. According to the first to third embodiments, a device manufacturing process is performed on a silicon substrate produced by the FZ or MCZ method. The present embodiment provides a method for forming a gettering layer on one surface of a silicon substrate before the substrate is subjected to a device manufacturing process.

Figure 5:
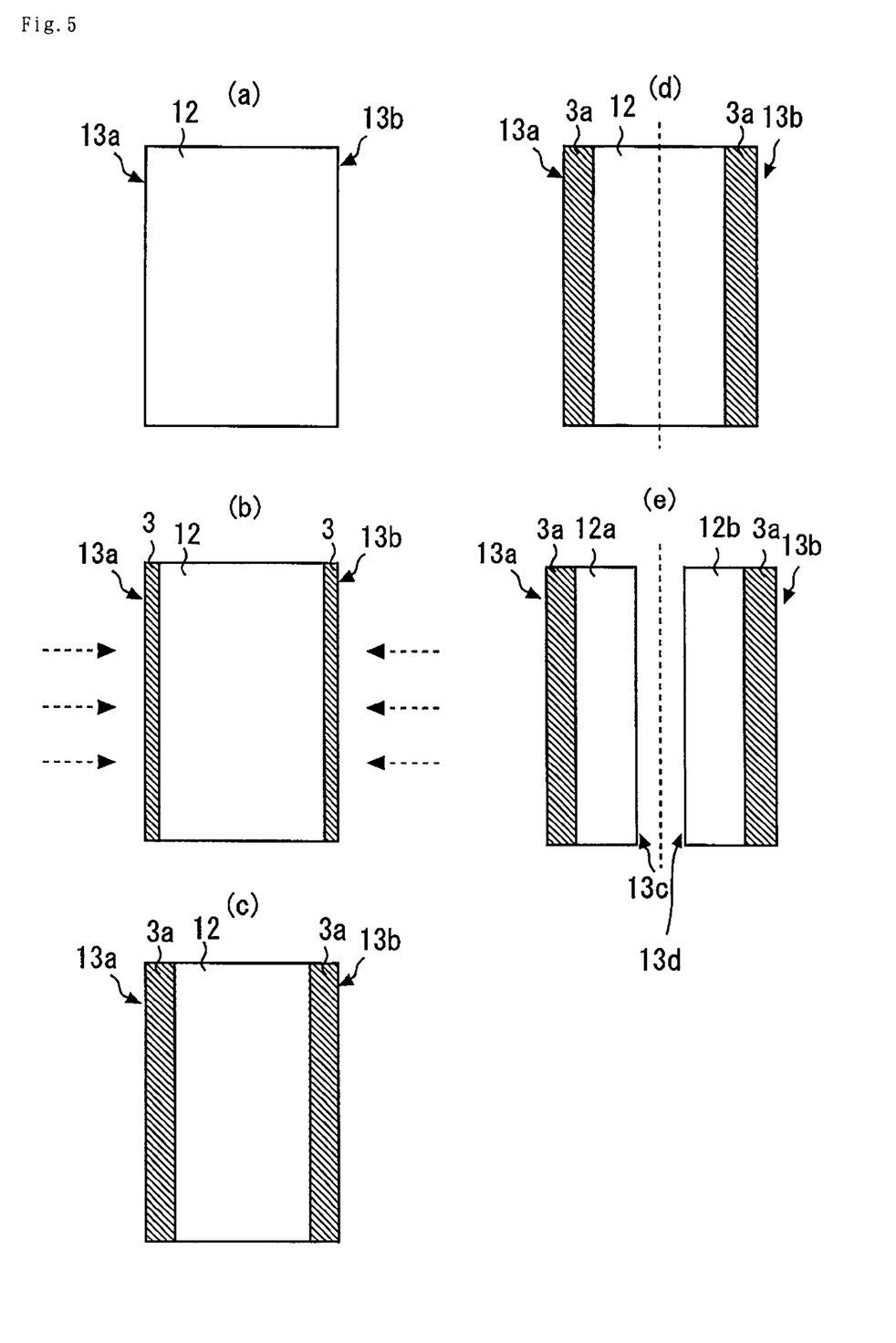
FIG. 5 Figure shows a manufacturing method for a semiconductor device according to a fourth embodiment.

First, a silicon ingot formed by the FZ or MCZ method is cut to produce a wafer 12 having a predetermined thickness, as shown in FIG. 5(a). This wafer has surfaces 13a and 13b. Next, phosphorus is diffused into these surfaces to form an impurity layer 3 on each surface. These impurity layers may be formed by phosphorus ion implantation, or by coating phospho silicate glass (PSG).

The impurity layers 3 are then heat treated at an elevated temperature to diffuse the impurity (phosphorus), with the result that a gettering layer 3a is formed on each of the surfaces 13a and 13b of the wafer 12, as shown in FIG. 15(c). These gettering layers have the effect of gettering heavy metals and dissolved oxygen, as in the first to third embodiments. It should be noted that the gettering layers are formed such that the amount of impurity does not exceed its solubility limit in the silicon substrate.

Next, as shown in FIG. 5(d), the wafer 12 is split into two thinner wafers by cutting along a plane perpendicular to the thickness direction of the wafer 12. Specifically, this step produces a wafer 12a having the surface 13a with a gettering layer 3a thereon, and a wafer 13b having the surface 13b with another gettering layer 3a thereon, as shown in FIG. 5(e). Then, the cut surfaces 13c and 13d are mirror finished. These surfaces 13c and 13d can be used as first principal surfaces of silicon substrates on which MOS gate devices, etc. are formed.

Thus, the two wafers 12a and 12b have their respective gettering layers 3a which are simultaneously formed before these wafers are produced by splitting as described above.

That is, only half as many wafers need be subjected to a gettering layer formation process as compared to the first to third embodiments.

Thus, the present embodiment provides a method for forming gettering layers 3a such as that described in connection with the first to third embodiments, the method including the steps of: forming a gettering layer on each surface of a wafer having a predetermined thickness, the wafer having been produced by the FZ or MCZ method; and splitting the wafer along a plane perpendicular to the thickness direction of the wafer to produce two silicon substrates each having a gettering layer on one principal surface side thereof.

Next, though not shown, devices such as MOS gates, etc. are formed on the surface 13c (or first principal surface) of the wafer 12a and on the surface 13d (or first principal surface) of the wafer 12b, as in the first to third embodiments. All the other components are the same as those described in connection with the first to third embodiments.

It should be noted that a protective film such as a silicon oxide film may be formed on each of the surfaces 13a and 13b before the impurity layer forming step described above (see FIG. 5(b)). Further, although in the present embodiment the gettering layers contain phosphorus as an impurity, it is to be understood that in other embodiments any other n-type impurity or any p-type impurity may be substituted therefor which has the effect of gettering heavy metal or dissolved oxygen.

Thus, the present embodiment allows a reduction in the number of wafers to be subjected to a gettering layer forming process resulting in reduced manufacturing cost while retaining the advantages of the first to third embodiments.

Fifth Embodiment

Figure 6:
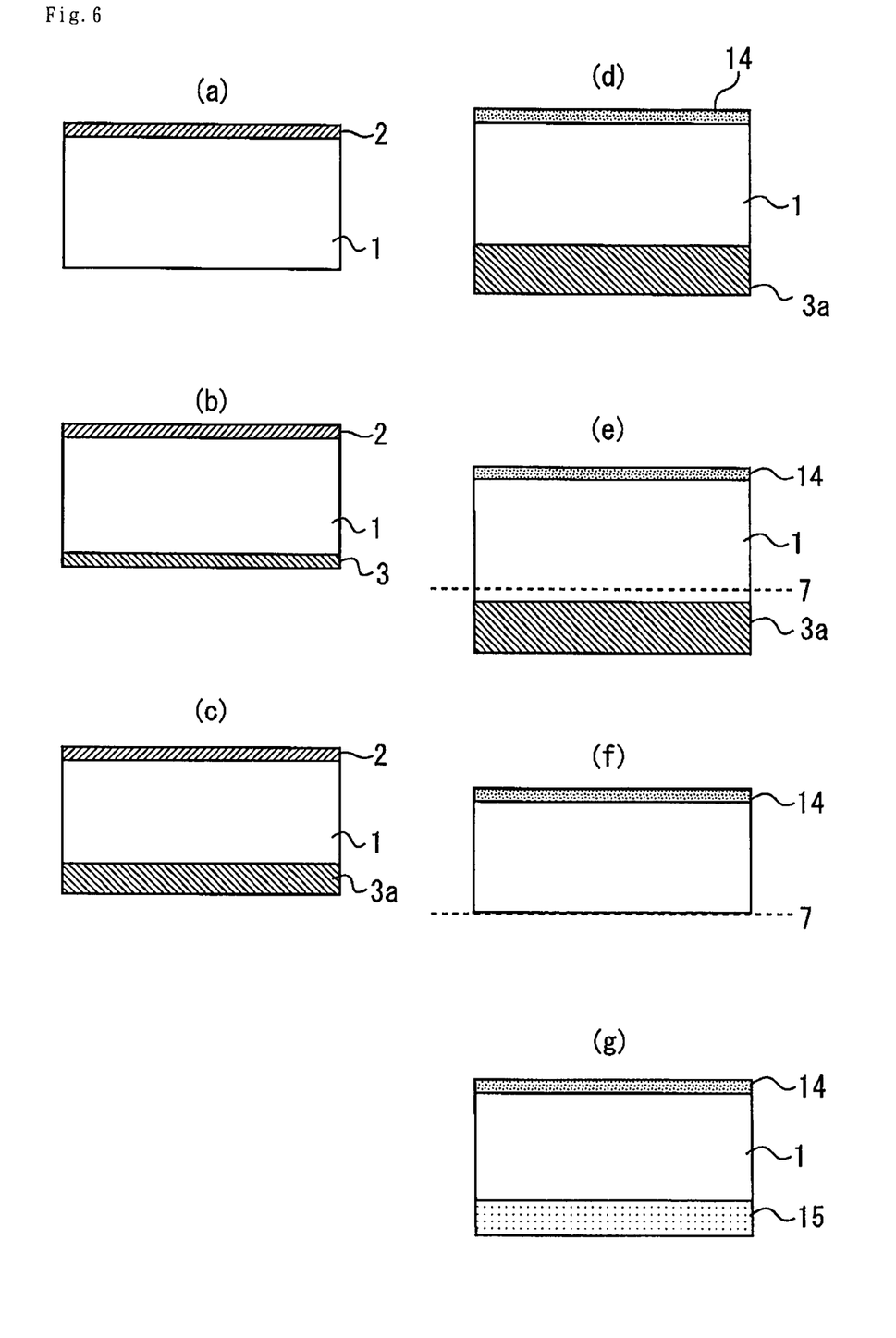
FIG. 6 Figure shows a manufacturing method for a semiconductor device according to a fifth embodiment.

There will now be described, with reference to FIG. 6, a method for manufacturing a semiconductor device, especially, a PIN (positive intrinsic negative) diode. This method begins by performing the three steps shown in FIGS. 6(a) to 6(c) from the step of forming a silicon oxide film 2 on a first principal surface of a silicon substrate 1 to the step of forming a gettering layer 3a on a second principal surface of the silicon substrate 1, as in the first embodiment (see FIGS. 1(a) to 1(c)). The gettering layer 3a has the effect of gettering dissolved oxygen or heavy metal in the silicon substrate, as in the first to fourth embodiments.

Next, the first principal surface of the silicon substrate 1 is ion-implanted with boron to form a p-type impurity layer thereon. A heat treatment is then performed to form a p-type anode electrode 14 on the first principal surface of the silicon substrate 1, as shown in FIG. 6(d). Then, referring to FIG. 6(e), the second principal surface of the silicon substrate 1 is mechanically ground to remove the portion of the substrate 1 below the broken line 7. This results in the removal of the entire gettering layer 3a, producing the structure shown in FIG. 6(f).

Although according to the above method the entire gettering layer 3a is removed, only a portion of the gettering layer 3a may be removed, as in the second embodiment.

The removal of at least a portion of the gettering layer 3a allows the removal of dissolved oxygen or heavy metal from the silicon substrate 1, thereby providing advantages similar to those of the first to fourth embodiments.

Next, an n-type impurity layer is formed on the second principal surface of the silicon substrate 1, for example, by phosphorus ion implantation. The impurity layer is then heat treated to form an n-type cathode electrode 15 on the second principal surface of the silicon substrate 1, as shown in FIG. 6(g).

According to the present embodiment, first the gettering layer 3a is formed on the second principal surface of the silicon substrate 1. Then, after removing the gettering layer 3a, the n-type cathode electrode 15 is formed on the second principal surface of the silicon substrate 1. This allows for t control, i.e., reducing the carrier lifetime of the cathode electrode 15 side when a device such as a high voltage diode is formed. This control corresponds to reducing the carrier lifetime of the n-type buffer layer 8 of the IGBTs described in connection with the first to fourth embodiments. Specifically, the t control enables a region of the silicon substrate to have a carrier lifetime that is one or more orders of magnitude shorter than those of the other regions.

Thus, according to the manufacturing method described above, the p-type anode electrode 14 is formed on the first principal surface of the silicon substrate 1, and the n-type cathode electrode 15 is formed on the second principal surface of the substrate 1. This structure is a vertical diode structure made up of the anode electrode 14, the silicon substrate 1, and the cathode electrode 15.

The present embodiment allows a device such as a high voltage diode to be formed in such a way that the carrier lifetime of the cathode electrode 15 side of the device is one or more orders of magnitude shorter than that of the other side. That is, the present embodiment provides local carrier lifetime control (t control) while retaining the advantages of the first to fourth embodiments.

A variation of the present embodiment will be described with reference to FIG. 7. While in the present embodiment the gettering layer 3a is formed on the second principal surface of the silicon substrate 1 (see FIG. 6), in this variation the gettering layer 3a is formed on the first principal surface of the silicon substrate 1.

Figure 7:
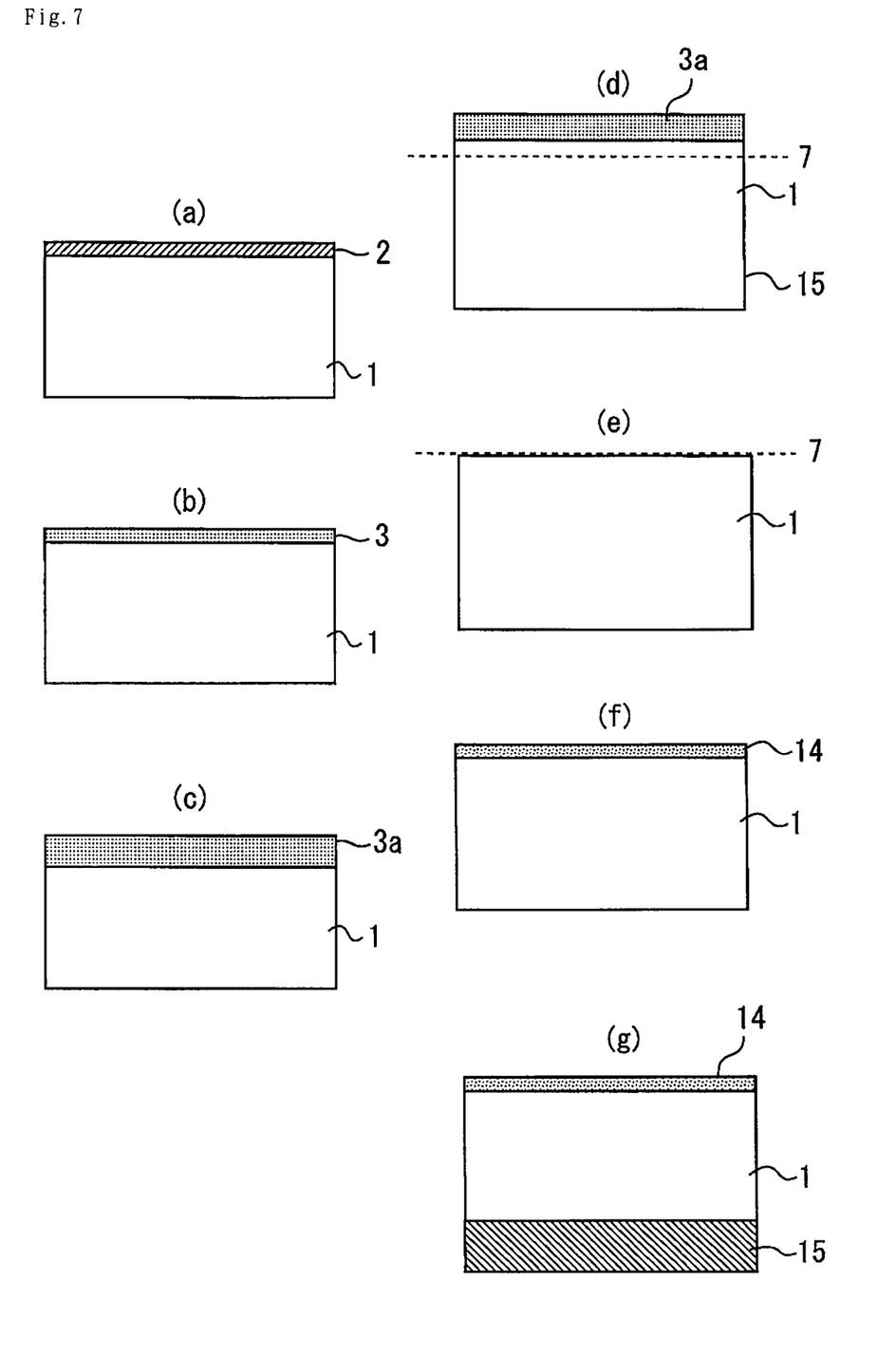
FIG. 7 Figure shows a variation of a manufacturing method for a semiconductor device according to a fifth embodiment.

This method begins by forming a silicon oxide film 2 on a first principal surface of a silicon substrate 1, as shown in FIG. 7(a). A p-type impurity layer is then formed in the first principal surface of the silicon substrate 1, and the silicon oxide film 2 is removed, producing the structure shown in FIG. 7(b). Next, the impurity layer 3 is heat treated to form a gettering layer 3a on the first principal surface of the silicon substrate 1, as shown in FIG. 7(c). The silicon substrate 1 is then heat treated to cause the gettering layer 3a to getter dissolved oxygen and residual metal present in the silicon substrate 1.

Then, referring to FIG. 7(d), the portion of the silicon substrate 1 above the broken line 7 is removed by grinding, etc. This results in the removal of the gettering layer 3a, producing the structure shown in FIG. 7(e). A p-type impurity layer is then formed on the first principal surface of the silicon substrate 1 and heat treated to form an anode electrode 14, as shown in FIG. 7(f). At that time, a pn junction having a breakdown voltage higher than a predetermined value is formed between the anode electrode 14 and the silicon substrate 1. Next, an n-type impurity layer is formed on the second principal surface of the silicon substrate 1 and heat treated to form a cathode electrode. This produces a vertical device structure made up of the anode electrode 14, the silicon substrate 1, and the cathode electrode 15. The main current flows between the anode electrode 14 and the cathode electrode 15 through the silicon substrate 1.

The manufacturing method of the above variation begins by providing a silicon substrate 1 having a first principal surface and a second principal surface and produced by the FZ or MCZ method. A gettering layer is then formed on the first principal surface of the silicon substrate 1 so as to be able to getter dissolved oxygen or residual metal in the silicon substrate 1. Next, the silicon substrate 1 is heat treated to getter dissolved oxygen or residual metal present in the silicon substrate 1. Then, after removing the gettering layer, a first conductive region of a first conductivity type is formed in the first principal surface of the silicon substrate 1, and a second conductive region of a second conductivity type is formed in the second principal surface of the silicon substrate 1.

Thus, the manufacturing method described above allows the manufacture of a semiconductor device including: a silicon substrate 1 having a first principal surface and a second principal surface and formed by the FZ or MCZ method; a trace-bearing portion provided in the first principal surface and including a trace of removal of a gettering layer for gettering dissolved oxygen or residual metal in the silicon substrate 1; a first conductive region of a first conductivity type provided in the first principal surface and covering the trace-bearing portion; and a second conductive region of a second conductivity type provided in the second principal surface; wherein the main current passes between the first and second principal surfaces.

Although the present embodiment and a variation thereof have been described as forming a PIN diode structure, it is to be understood that, like the first embodiment, they may be applied to semiconductor devices in which a gate structure of an IGBT, etc. is formed on the first principal surface of the silicon substrate 1.

Figure 8:
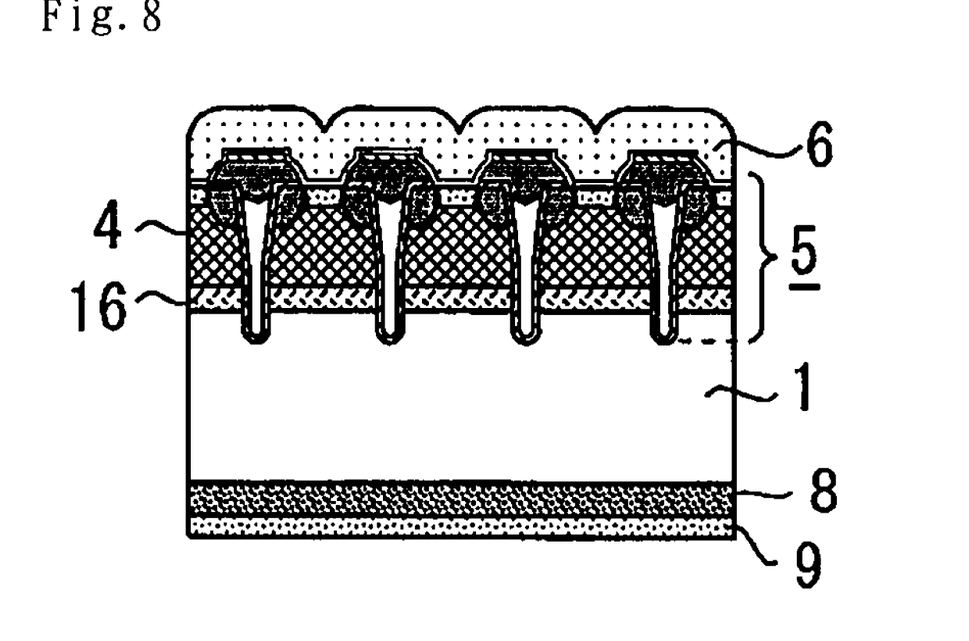
FIG. 8 Figure shows a variation of a semiconductor device according to these embodiments.
Figure 9:
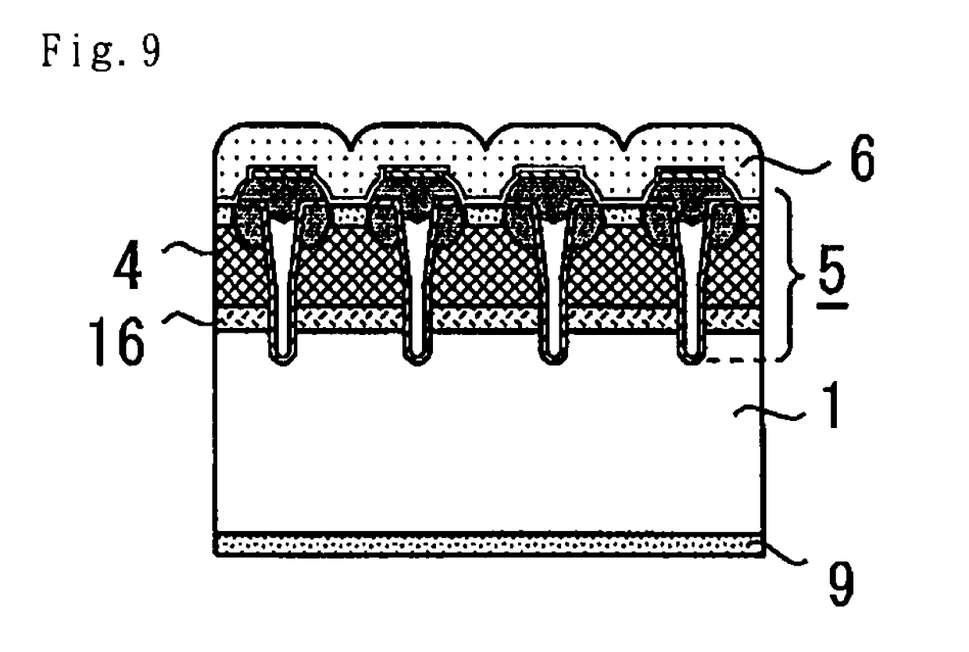
FIG. 9 Figure shows a variation of a semiconductor device according to these embodiments.

The first to fifth embodiments have been described in connection with structures in which a p-type diffusion layer 4 is provided on a first principal surface of a silicon substrate 1 containing an n-type impurity. However, these embodiments may be applied to a variation of these structures, in which an n-type impurity layer 16 having a higher n-type impurity concentration than the silicon substrate 1 is provided under the p-type diffusion layer 4, as shown in FIG. 8. Further, they may be applied to a structure in which the silicon substrate 1 has no n-type buffer layer on its second principal surface side, as shown in FIG. 9.

What is claimed is:

1. A method for manufacturing a semiconductor device, comprising:
   forming a gettering layer containing an n-type impurity or a p-type impurity on a second surface of a silicon substrate formed by a floating zone method or a magnetic field applied Czochralski method, wherein said silicon substrate has a first surface;
   heat treating said silicon substrate so that said gettering layer getters dissolved oxygen or residual metal in said silicon substrate;
   forming a first conductivity type region in said first surface of said silicon substrate; and
   removing a portion of said gettering layer from said substrate and leaving a remaining portion of the gettering layer having a predetermined thickness as a second conductivity type region,
   the method further comprising:
   forming a metal wiring on said first surface after said heat treating said silicon substrate and before said removing said portion of said gettering layer.

2. The method as claimed in claim 1, wherein said heat treating said silicon substrate is such that said gettering layer getters said dissolved oxygen in said silicon substrate.

3. The method as claimed in claim 1, wherein said forming said gettering layer is effected by impurity diffusion or ion implantation.

4. The method as claimed in claim 1, wherein said forming said gettering layer includes:
   forming a gettering layer on each surface of a wafer having a predetermined thickness, said wafer having been formed by the floating zone method or the magnetic field applied Czochralski method; and
   splitting said wafer into two halves along a plane perpendicular to the thickness direction of said wafer to produce said silicon substrate.

* * * * *